United States Patent [19]
Dodabalapur et al.

[11] Patent Number: 5,904,994
[45] Date of Patent: May 18, 1999

[54] BLUE-EMITTING MATERIALS AND ELECTROLUMINESCENT DEVICES CONTAINING THESE MATERIALS

[75] Inventors: Ananth Dodabalapur, Millington; Rebecca Jordan, Berkely Heights, both of N.J.; Marko Strukelj, Wilmington, Del.

[73] Assignee: Lucent Technologies Inc., Murray Hill, N.J.

[21] Appl. No.: 08/673,864

[22] Filed: Jul. 2, 1996

Related U.S. Application Data

[60] Provisional application No. 60/003,721, Sep. 13, 1995.
[51] Int. Cl.$^6$ ..................................................... H05B 33/00
[52] U.S. Cl. ........................ 428/690; 428/917; 428/704; 428/457; 428/332; 313/504; 313/506
[58] Field of Search ..................................... 428/690, 917, 428/704, 457, 332; 313/504, 506; 252/301.25, 301.27, 301.28, 301.31, 301.32; 544/336; 546/134, 152; 548/235, 335.1, 343.5

[56] References Cited

U.S. PATENT DOCUMENTS

| | | | |
|---|---|---|---|
| 3,684,764 | 8/1972 | Buell | 252/301.32 |
| 3,843,632 | 10/1974 | Matsuo et al. | 548/235 |
| 3,976,656 | 8/1976 | Hammond | 548/235 |
| 5,077,142 | 12/1991 | Sakon et al. | 428/690 |
| 5,151,629 | 9/1992 | VanSlyke | 313/504 |

FOREIGN PATENT DOCUMENTS 0 516 409 A2  12/1992  European Pat. Off. .

OTHER PUBLICATIONS

"The Action of Ammonia on Benzoin", by Davidson, D., Weiss, M., Jelling, M., *J. Org. Chem*, pp. 328–334 (1937).
"Electroluminescence of Doped Organic Thin Films", by Tang, C. W., VanSlyke, Chen, C.H., *J. Appl. Phys.*, 65(9) pp. 3610–3616 (May 1, 1989).
"White Light From an Electroluminescent Diode Made From Poly[3(4–Octylphenyl)–2,2'–Bithiophene] and an Oxadiazole Derivative", by Berggren, M., Gustafsson, Inganas, O., Andersson, M. R., Hjertberg, T., Wennerstrom, O., *J. Appl. Phys.* 76(11), pp. 7530–7534 (Dec. 1, 1994).
"Novel Structure of Organic Electroluminescence Cells With Conjugated Oligomers", Hosokawa, C., Higashi, H., Kusumoto, T., *Appl. Phys. Lett.* 62(25) pp. 3238–3240 (Jun. 21, 1993).
"Liquid Scintillators. V. Absorption and Fluorescence Spectra of 2,5–Diaryloxazoles and Related Compounds", by Ott, D. G., Hayes, F. Newton, Hansbury, E., Kerr. V.N., J.A.C.S. vol. 79, pp. 5448–5454 (Apr. 10, 1957).
"Electroluminescent Element—In Which Fluorescent Luminous Layer Contains an Oxazole CPD", Derwent Publications Ltd., AN 91–249194 and JP 03 162 482 A, Jul. 12, 1991.
"Organic Electroluminescent Device", by Yoshio, H. et al., *Patent Abstracts of Japan*, vol. 095, No. 009, (Oct. 31, 1995) and JP 07 150137 A (Jun. 13, 1995).
"White Organic Electroluminescent Devices", by Jordan, R. H. et al., *Appl. Phys. Lett.*, 68(9), pp. 1192–1194, (Feb. 26, 1996).

*Primary Examiner*—Marie Yamnitzky
*Attorney, Agent, or Firm*—Richard J. Botos

[57] ABSTRACT

A class of blue emitting materials, that, when placed in EL devices with an emitter layer and a hole transporter layer, provide EL devices that emit white light. The blue-emitting material has a non-polymeric molecular structure that comprises a five or six-membered heterocyclic moiety selected from the groups consisting of oxazole, imidazole, quinoline and pyrazine with at least three substituents pendant thereto. The blue-emitting materials of the present invention have certain characteristics that allow them to be formed into films with advantageous properties. The films formed from these materials are amorphous (i.e they have a crystal size less than about 1000 Å). The thickness of the films of the blue-emitting material is less than 600 Å in the devices of the present invention.

10 Claims, 3 Drawing Sheets

BLUE-EMITTING MATERIALS AND ELECTROLUMINESCENT DEVICES CONTAINING THESE MATERIALS

CROSS-REFERENCE TO RELATED APPLICATION

This application claims priority of Provisional Application Serial No. 60/003,721 filed Sep. 13, 1995.

This application is related to an application entitled "Article Comprising a Microcavity Light Source", U.S. Ser. No. 08/528,389(now U.S. Pat. No. 5,674,636), which was filed simultaneously with the provisional application.

BACKGROUND OF THE INVENTION

1. Technical Field

The present invention is directed to electroluminescent devices with thin layers of organic material interposed between the anode and the cathode.

2. Art Background

Electroluminescent (EL) devices which have organic thin layers interposed between the anode and the cathode are used to fabricate flat panel displays. These EL devices are made into large-area, extremely thin full color displays. The structure of these devices is simple, as illustrated in FIG. 1. The EL device depicted in FIG. 1 consists of two layers of organic material, 10 and 12, interposed between an anode 14 and a cathode 16. The structure is formed on a glass substrate 18. In such devices, one of the organic layers functions as either a hole transporter or an electron transporter, and the other layer functions as an emitter layer. Typically, if the transporter layer is adjacent to the cathode, it functions as an electron transporter and if the transporter layer is adjacent to the anode it functions as a hole transporter.

In addition to EL devices that emit various discrete colors, EL devices that emit white light (or other unsaturated color light) are also desired. EL devices that emit white light are typically devices which emit light throughout the visible spectrum of red, green, and blue.

A device that emits white light is described in Berggren, M., et al., "White light from an electroluminescent diode made from poly[3(4-octylphenyl)-2,2'-bithiophene] and an oxadiazole derivative," Journal of Applied Physics, 76:11, pp. 7530–7534 (December 1994). In the Breggren device, depicted in FIG. 1, the cathode 16 is aluminum, the anode 14 is indium-tin-oxide (ITO) and the organic layers 10 and 12 are poly(3-(4-octylphenyl)-2,2'-bithiophene) (PTOPT) and 2-(4-biphenylyl)-5-(4-tertbutylphenyl)-1,3,4-oxadiazole(PBD), respectively. In the Breggren devices, the PTOPT layer emits red and the PBD layer emits blue. There is no layer that emits green in the Breggren devices. Breggren represents that the emission of green light in its devices results from an interaction between the PBD and PTOPT layers.

The problems associated with EL devices are the efficiency and brightness of the emission and the stability of the organic films used to make the devices. Promising materials for EL devices are described in Tang, C. W., et al., "Electroluminescence of doped organic thin films," *J.Appl.Phys.*, 65:9 pp. 3610–3616 (May 1, 1989). Tang et al. describe devices in which a layer of bis(triphenyl)diamine (TBD) and a layer of tris(8-hydroxyquinoline)aluminum (ALQ) are sandwiched between an ITO electrode and a Mg:Ag (1:10) electrode. The ALQ layer is reported to be two layers of ALQ with a layer of ALQ doped with either coumarin 540, DCM1, or DCM2 between the two ALQ layers. Tang et al. report that these devices emit in wavelength ranges from 450 nm to 675 nm (blue-green to orange-red). Tang et al. report that this wavelength range is imposed by the ALQ host.

Because of the efficiency of these emitting materials, devices that emit white light that use ALQ in conjunction with a diamine such as a bis(triphenyl)diamine derivative (TAD) are desired. However, such devices require additional materials to broaden the emission range to emit white light, particularly on the short wavelength side. These additional materials not only must emit in wavelengths which complement the emission spectrum of the ALQ, they should emit in that wavelength in the solid (i.e. film) state. Consequently, materials that, when incorporated into an EL device with an ALQ emitter layer, provide an EL device that emits white light, are desired.

SUMMARY OF THE INVENTION

The present invention is directed to materials that form blue emitter films for use in LEDs. The present invention is also directed to LEDs that contain a blue emitter layer made of materials of the present invention. For purposes of the present invention, blue emitter films are films that have a substantial component of their emission spectrum in the wavelength range of about 400 nm to about 500 nm. For purposes of the present invention, "substantial" means that at least over fifty percent, and preferably over eighty percent, of the peak area in the emission spectrum is in the specified wavelength range. The materials of the present invention are non-polymerizable (i.e. the materials contain no ethylenic unsaturation) and contain at least one unsaturated, five or six-membered heterocyclic moiety with at least one nitrogen atom incorporated into the heterocycle. These moieties are incorporated into molecules that form amorphous films when deposited using conventional techniques such as vacuum sublimation. For purposes of the present invention, amorphous means that the crystal size in the film is typically 1000 Å or less. In a preferred embodiment, these moieties are selected from the group consisting of oxazole, imidazole, quinoline, and pyrazine. In order for these materials to form films with the desired characteristics, the materials have at least three substituents, designated collectively as $R_n$, pendant to the heterocyclic moiety, referred to generally herein as X. Since n is an integer that is greater than or equal to 3, at least three R groups are attached to the X moiety, and these R groups are either the same or different. In a preferred embodiment, at least two of these R groups are chemically different from each other. For example, if the X moiety is an oxazole moiety, then n is equal to three. In this embodiment $R_1$ and $R_2$ are aryl moieties and $R_3$ is a naphthyl moiety. The R groups are chosen so that the shape of the molecule about the heterocyclic moiety is spherical. Also, for purposes of the present invention, it is advantageous if the $R_n$ groups are positioned out of the plane of the X group to provide amorphous films when the materials are formed into films using vacuum sublimation.

In one preferred embodiment of the present invention, X is an oxazole moiety or an imidazole moiety and the material has the general structure:

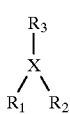

wherein $R_1$ and $R_2$ are the same and are selected from the group consisting of phenyl and methoxyphenyl and $R_3$ is different from $R_1$ and $R_2$ and is selected from the group consisting of phenyl and naphthyl. Optionally, the hydrogen atoms on $R_1$, $R_2$, and $R_3$ may be substituted with other moieties. Examples of these other moieties include halogen moieties (e.g. fluorine and chlorine), methoxy moieties, halocarbon moieties, dimethylamine moieties and cyano moieties. If $R_1$ and $R_2$ are so substituted, it is advantageous if $R_1$ and $R_2$ are substituted phenyl moieties. In one embodiment, the compound contains two oxazole or imidazole moieties and the general structure is:

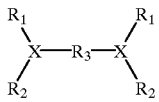

wherein $R_1$, $R_2$, and $R_3$ are as described with one exception, $R_3$ can be the same as $R_1$ and $R_2$. In a preferred embodiment, $R_1$, $R_2$, and $R_3$ are all phenyl moieties.

In another preferred embodiment, X is a quinoline moiety and the material has the general structure:

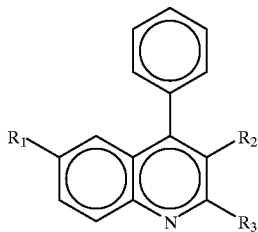

wherein $R_1$ is a halogen moiety selected from the group consisting of fluorine, chlorine and bromine. $R_2$ is either hydrogen, phenyl, methoxyphenyl, or naphthyl, and $R_3$ is phenyl, methoxy phenyl, or naphthyl. As noted above, the hydrogen atoms affixed to $R_1$, $R_2$, and $R_3$ may be substituted by other moieties.

In another embodiment, X is a pyrazine moiety and the material has the general structure:

wherein $R_1$ and $R_2$ are cyano and $R_3$ and $R_4$ are tert-butyl phenoxyphenyl or methoxyphenyl.

The above described materials are used as a blue emitter layer in EL devices. In such devices the blue-emitter layer is sandwiched between a hole transporter material and an electron transport material. For the EL device to emit white light, the layers of the transporter materials and other emitter materials that emit light within other wavelength ranges are sandwiched between an anode and a cathode.

In a preferred embodiment, the EL device is a glass substrate over which is formed a layer of indium tin oxide (ITO), which functions as the anode. Over the ITO layer is formed a layer of a hole transporter such as a bis(triphenyl) diamine derivative (TAD), which emits light in the wavelength range of about 400 nm to about 500 nm. However, in the devices of the present invention, the TAD layer functions as a hole transporting layer, and does not emit light. Over the TAD layer is formed a layer of one of the blue emitting materials described above. The layer of blue emitting material emits light in the wavelength range of about 400 nm to about 500 nm and has a thickness that does not exceed 600 Å and is advantageously about 100 Å to about 300 Å. Over the blue-emitting layer is formed a layer of an electron transporter such as tris(8-hydroxyquinoline) aluminum (ALQ), which emits light in the wavelength range of about 450 nm to about 675 nm. Over the ALQ layer is formed a cathode. Typically the cathode is a layer of metal or a combination of metals. Examples of cathode materials are aluminum and multilayer structures of aluminum and other metals. These devices emit light within a range of about 400 nm to about 650 nm. Therefore, the light emitted by these devices appears to be white. These devices offer a considerable advantage over the devices described by Tang et al., which are reported to emit over the range of 500 nm to 650 nm.

In a preferred embodiment, the TAD layer has a thickness of about 60 nm to about 90 nm, the ALQ layer has a thickness of about 50 nm to about 90 nm, and the blue emitter layer has a thickness of about 10 nm to about 30 nm. In a preferred embodiment, the device has a layer of ALQ with a red emitting dye such as DCM1 incorporated therein (hereinafter referred to as the doped ALQ layer). ALQ doped with DCM1 is described in Tang et al., which is hereby incorporated by reference. The doped ALQ layer is in addition to the (undoped) ALQ layer previously described. In this embodiment, it is advantageous if a layer of doped ALQ with a thickness of about 50 Å to about 300 Å is sandwiched between two thin (e.g. a thickness of about 20 nm to about 30 nm) layers of undoped ALQ.

In the devices of the present invention, the emission spectrum has a broader spectral width than devices that have an ALQ emitter layer without the blue emitter layers of the present invention. Thus, whereas previous ALQ emitter devices emit only in a limited wavelength range (typically in the blue-green or orange-red spectrum), the devices of the present invention emit white light. Since EL devices that emit white light are particularly useful in applications such as displays, it follows that the devices of the present invention are useful in display applications. The materials of the present invention, when formed into a film sanwiched between a diamine hole transporter layer and and ALQ electron transporter layer in an EL device, provides an EL device that emits white light. The materials of the present invention form stable, homogeneous films with a crystal size that is less than 1000 Å when sublimed onto the diamine layer. It is advantageous if the resulting EL devices emit light with an efficiency of at least about 0.5 lumens/watt.

DETAILED DESCRIPTION

Figure 1:
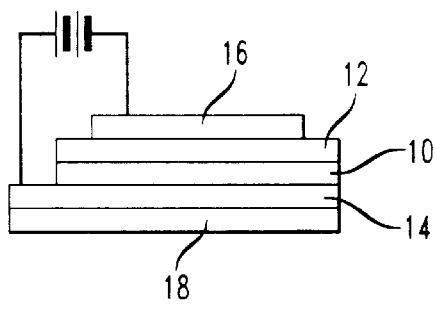
FIG. 1 is an illustration of a prior art EL device.

The present invention is directed to materials that form blue emitter films for use in LEDs. The present invention is also directed to LEDs that contain a blue emitter layer made of materials of the present invention. For purposes of the present invention, blue emitter films are films that emit in the wavelength range of about 400 nm to about 500 nm. The materials of the present invention are non-polymerizable (i.e. the materials contain no ethylenic unsaturation) and contain at least one unsaturated, five or six-membered heterocyclic moiety with at least one nitrogen atom incorporated into the heterocycle. These moieties are incorporated into molecules that form amorphous films when deposited using conventional techniques such as vacuum sublimation. For purposes of the present invention, amorphous means that the crystal size in the film is typically 1000 Å or less. Films that are crystalline or polycrystalline (i.e., the films have a crystal size that is greater than 1000 Å and are, therefore, not amorphous) typically contain grain boundaries that adversely effect the electrical efficiency of the film emission by trapping carriers. Such polycrystalline films tend to be non-uniform and opaque (i.e., they scatter light), especially when the thickness of these films is less than 1000 Å. Non-uniform films typically contain paths for short circuits and sites for carrier traps, which adversely affect the efficiency of the film.

In a preferred embodiment, these moieties are selected from the group consisting of oxazole, imidazole, quinoline, and pyrazine. In order for these materials to form films with the desired characteristics, the materials have at least three substituents, designated collectively as $R_n$, pendant to the heterocyclic moiety, referred to generally herein as X. Since n is an integer that is greater than or equal to 3, at least three R groups are attached to the X moiety, and these R groups are either the same or different. In a preferred embodiment, at least two of these R groups are chemically different from each other. For example, if the X moiety is an oxazole moiety, then n is equal to three. In this embodiment $R_1$ and $R_2$ are aryl moieties and $R_3$ is a naphthyl moiety. As noted previously herein, the R groups are chosen so that the structure of the molecule surrounding the heterocycle is spherical.

In one preferred embodiment of the present invention, X is an oxazole moiety and the material has the general structure:

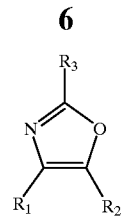

wherein $R_1$ and $R_2$ are the same and are selected from the group consisting of phenyl and methoxyphenyl and $R_3$ is different from $R_1$ and $R_2$ and is selected from the group consisting of phenyl and naphthyl. Optionally, the hydrogen atoms on $R_1$, $R_2$, and $R_3$ may be substituted with other moieties. Examples of these other moieties include halogen moieties (e.g. fluorine and chlorine), methoxy moieties, halocarbon moieties, diemethylamine moieties, and cyano moieties. In one embodiment, the compound contains two oxazole moieties and the general structure is:

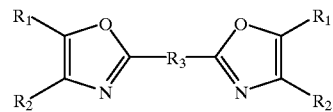

wherein $R_1$, $R_2$, and $R_3$ are as described with one exception: $R_3$ can be the same as $R_1$ and $R_2$. In a preferred embodiment, $R_1$, $R_2$, and $R_3$ are all phenyl moieties.

In another preferred embodiment of the present invention, X is an imidazole moiety and the material has the general structure:

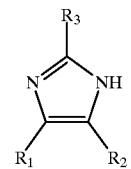

wherein $R_1$ and $R_2$ are the same and are selected from the group consisting of phenyl and methoxyphenyl and $R_3$ is different from $R_1$ and $R_2$ and is selected from the group consisting of phenyl and naphthyl. Optionally, the hydrogen atoms on $R_1$, $R_2$, and $R_3$ may be substituted with other moieties. These other moieties are either halogen moieties (e.g. fluorine and chlorine), methoxy moieties, halocarbon moieties, dimethylamine moieties, or cyano moieties. In one embodiment, the compound contains two imidazole moieties and the general structure is:

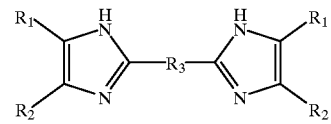

wherein $R_1$, $R_2$, and $R_3$ are as described with one exception: $R_3$ can be the same as $R_1$ and $R_2$. In a preferred embodiment, $R_1$, $R_2$, and $R_3$ are all phenyl moieties.

In another preferred embodiment, X is a quinoline moiety and the material has the general structure:

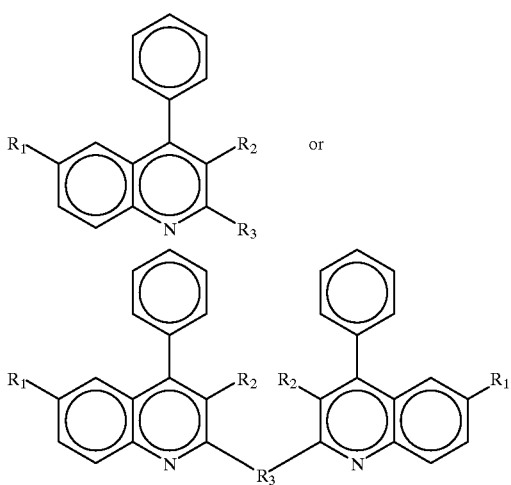

wherein $R_1$ is a halogen moiety, selected from the group consisting of fluorine, chlorine and bromine. $R_2$ is either hydrogen, phenyl, methoxyphenyl, or napthyl and $R_3$ is phenyl, methoxyphenyl, or napthyl. As noted above, the hydrogen atoms affixed to $R_1$, $R_2$, and $R_3$ may be substituted by other moieties.

In another embodiment, X is a pyrazine moiety and the material has the general structure:

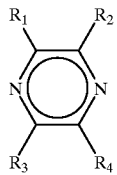

wherein $R_1$ and $R_2$ are cyano and $R_3$ and $R_4$ are tert-butyl phenoxyphenyl or methoxyphenyl.

Figure 2A:
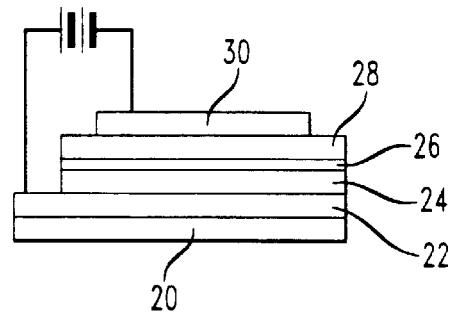
FIGS. 2A and 2B illustrate two device embodiments of the present invention.

An embodiment of the present invention is illustrated in FIG. 2A. The device is a sequence of layers formed on a glass substrate 20. A layer of indium tin oxide (ITO) 22 is formed over the glass substrate 20. Over the ITO layer 22 is formed a layer of a hole transporter such as TAD 24. Other hole transporter materials, such as sexithienyl and sexiphenyl derivative (described in Hosokawa, C., "Novel Structures of Organic Electroluminescence Cells with Conjugated Oligomers," *Appl. Phys. Lett.*, 62:25, pp. 3238–3240 (1993) which is hereby incorporated by reference), are also contemplated as suitable hole transporter materials in the devices of the present invention. Over this layer 24 is formed a layer of the blue emitting material 26 of the present invention. Over the layer 26 is formed an electron transporter layer of tris(8-hydroxyquinoline) aluminum (ALQ) 28. Over the layer 28 is formed a cathode 30. In one embodiment of the present invention, the cathode is aluminum which is formed over the ALQ layer using known techniques such as resistive heating vacuum deposition. In another embodiment, the cathode is a dual layer of lithium and aluminum, in which case a lithium layer with a thickness of about 10 Å to about 20 Å is first formed over the ALQ layer. A thick (e.g. about 2000 Å) layer of aluminum is then formed over the lithium layer. These devices emit light within a range of 400–650 nm. Therefore, the light emitted by these devices appears to be white. These devices offer a considerable advantage over the devices described by Tang et al., which they report only emit light in the range of 500 nm to 650 nm. In a preferred embodiment, the TAD layer has a thickness of about 60 nm to about 90 nm, the ALQ layer has a thickness of about 50 nm to about 90 nm, and the blue emitter layer has a thickness of about 10 nm to about 30 nm.

Figure 2B:
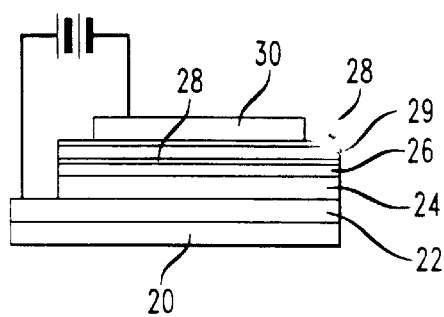

An alternate embodiment of the devices of the present invention is depicted in FIG. 2B. The device in FIG. 2B is also formed on a glass substrate 20 over which are formed, sequentially, an ITO layer 22, a hole transporter layer 24, and a layer of the blue-emitter material of the present invention 26. A thin layer 28 (i.e. a layer with a thickness of about 200 Å to about 300 Å) of ALQ is formed over the blue emitting layer. A thin (i.e. a thickness of about 50 Å to about 300 Å) layer of ALQ doped with about 0.2 weight percent to about 1 weight percent DCM1 (a red emitting dye that is obtained from Exciton of Dayton, Ohio) 29 is then formed over the ALQ layer 28. Another thin layer 28 of the ALQ is then formed over the doped ALQ layer 29. A cathode layer 30 is then formed over the second undoped ALQ layer 28. Suitable materials for the cathode layers of the devices described above are known to one skilled in the art. Examples of suitable cathode materials are aluminum and a dual layer of lithium and aluminum (Li:Al).

EXAMPLE 1

To a 500 mL round-bottom (rb) flask equipped with a thermometer and an $N_2$ inlet was added 1,4-dibromo-2,5-dimethoxybenzene (15 g; 50.68 mmol; prepared via Lancaster synthesis), Bis(triphenylphosphine) palladium (II) chloride (0.85 g; 1.21 mmol); copper (II) acetate (0.216 g; 1.19 mmol) and tetrahydrofuran (THF). The palladium and copper compounds, and the THF, were obtained from the Aldrich Co. Unless otherwise indicated, the materials used in the examples were obtained from the Aldrich Chemical Co. of Milwaukee, Wis. The solution was outgassed using vaccuum while being stirred., and the flask was then evacuated and refilled three times with $N_2$. Phenylacetylene (15.53 g; 152.05 mmol) was added dropwise over 15 minutes with a syringe. The mixture was heated to 60° C. After 15 hours, the reaction was cooled to 23° C. and bis (triphenylphosphine) palladium (II) chloride (0.5 g) and phenylacetylene (5mL) were added to the solution, which was then reheated to 60° C.

Figure 3:
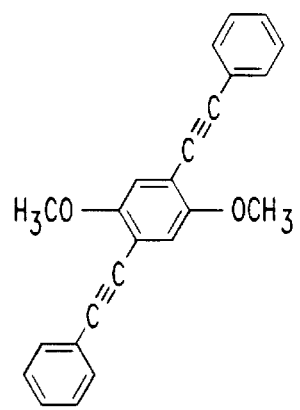
FIG. 3 is an illustration of the chemical compound bis-1,4-(phenylacetylene)-2,5-dimethoxybenzene.

After a total of 48 hours had elapsed, the mixture was cooled and concentrated under reduced pressure. Aqueous hydrochloric acid (HCl) (2% by volume HCl; 200 mL) and ethyl acetate (EtOAc)(250mL) were added to the mixture and the solution was stirred for about 10 minutes. The solution was filtered and a yellow solid was obtained. Water (300 mL) was added to the yellow solid, and the mixture was stirred for two hours. After filtration and drying, a yellow solid (11.56 g) was obtained. The yellow solid was placed in a solution of ethyl alcohol and dimethyl acetamide (DMAc) (3:1) which resulted in the formation of long green-brown needles (8.52 g). The resulting product was characterized as bis-1,4-(phenylacetylene)-2,5-dimethoxybenzene. This product is illustrated in FIG. 3.

EXAMPLE 2

To a 500 mL rb flask equipped with an $N_2$ inlet and a coldwater condenser was added 1-naphthoyl chloride (9.25 g; 48.52 mmol), THF (100 mL) dimethoxybenzoin (12.93 g; 47.5 mmol), triethylamine (6.97 mL; 50 mmol) and pyridine (0.5 mL) while stirring. After 1.5 hours at room temperature the reaction was about 50 percent complete [as determined by thin layer chromatography (TLC on silica gel in a 1:1 solution of petroleum ether and EtOAc)]. After stirring overnight, the solution was concentrated to a solid to which was added 300 mL of water. The resulting mixture was titrated with ethyl ether (EtOEt) to obtain a precipitate. A white solid (15.92 g) was obtained by filtering and drying the precipitate. The product was then recrystallized from EtOH/DMAc as described above.

Figure 4:
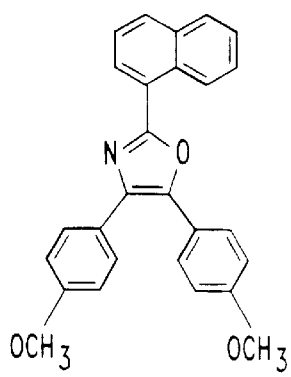
FIG. 4 is an illustration of the chemical compound 2-napthyl-4,5-(4-methoxyphenyl)oxazole.

The product (12.7 g; 29.8 mmol) was added to a 250 mL rb flask, equipped as described above, to which was added glacial acetic acid (115 mL) and ammonium acetate (13.7 g; 178.8 mmol). The mixture was refluxed for 2 hours, cooled to room temperature, and diluted to about 850 mL with water. The precipitate was filtered and dried, and recrystallization from aqueous acetic acid (4:1) yielded what was confirmed to be 2-napthyl-4,5-(4-methoxyphenyl)oxazole, which is illustrated in FIG. 4.

EXAMPLE 3

To a 500 mL rb flask equipped with an $N_2$ inlet and a coldwater condenser was added benzoin (10 g; 47.11 mmol), THF (40 mL), and triethylamine (9 mL; 57.01 mmol) After two minutes, 1-napthyl chloride (9.88g; 51.83 mmol) was added all at once while the mixture was stirred. An amine hydrochloride also formed almost immediately. THF (40 mL in two 20 mL increments) was added to the solution over 15 minutes. The solution was heated to 25° C. and stirred for 48 hours. The salt was then removed by filtration. The salt was washed with THF and combined with the reaction mixture to form a yellow solution. The solution was concentrated using suction while maintained at 25° C. The product was then recrystallized from EtOH/DMAc (300 mL/20 mL) as described above. A white crystalline product was obtained.

Figure 5:
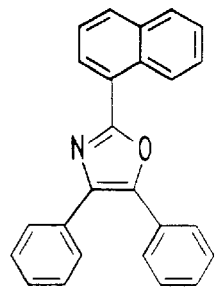
FIG. 5 is an illustration of the chemical compound 2-napthyl-4,5-diphenyloxazole.

The product (10 g; 27.3 mmol) was added to a 250 mL rb flask, equipped as described above, to which was added glacial acetic acid (50 mL) and ammonium acetate (12.6 g; 163.7 mmol). The mixture was heated to reflux, and maintained at reflux overnight. Glacial acetic acid was added during reflux in portions over 1.5 hours, providing a clear and colorless solution. The solution was cooled to room temperature, and diluted with about 300 mL water. The resulting precipitate was filtered and dried, and recrystallization from ethanol twice yielded what was confirmed to be 2-napthyl-4,5-(diphenyl)oxazole, which is illustrated in FIG. 5.

EXAMPLE 4

To a 250 mL rb flask as described above was added terephthaloyl chloride (5 g; 24.63 mmol); benzoin (11.5 g; 54.18 mmol) and anhydrous THF (40 mL). The mixture was stirred at 25° C. for 2 minutes to dissolve most of the solids. Triethylamine (9 mL; 64.57 mmol) was added all at once. An amine hydrochloride salt formed immediately and the solution became very viscous. THF (80 mL in four 20 mL increments) was added over 30 minutes. The solution, maintained at 25° C. was stirred for 48 hours. The solution was filtered to remove the salt. The salt was washed with THF and combined with the mixture. The mixture was concentrated by suction overnight at 25° C. The resulting solid was stirred in 250 mL of water for 5 minutes, and then filtered and dried. The solid was refluxed in isopropanol (250 mL; 3 times) and filtered and dried to obtain a white crystalline solid.

Figure 6:
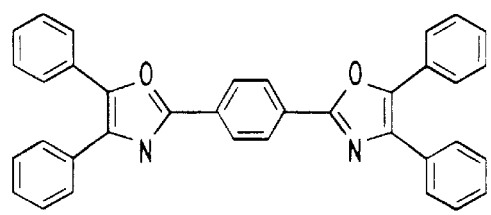
FIG. 6 is an illustration of the chemical compound 2,2'-(4-phenylene)bis(4,5-diphenyloxazole).

The crystalline solid was added to a 500 mL flask equipped as described above. To the flask was added glacial acetic acid (50 mL), and ammonium acetate (10.4 g; 135 mmol). The resulting white heterogeneous mixture was heated to reflux. Glacial acetic acid (175 mL in seven 25 mL increments) was added over a period of four hours. The mixture was refluxed overnight. TLC indicated that two products were present. Ammonium acetate (5 g) and acetic acid (150 mL) were added to the mixture which was then refluxed for another 24 hours. The mixture was then cooled to room temperature and poured into water (400 mL). The resulting mixture was filtered and dried. The product recrystallized from DMAc was confirmed to be 2,2'-(4-phenylene)bis(4,5-diphenyloxazole). This compound is illustrated in FIG. 6.

EXAMPLE 5

Figure 7:
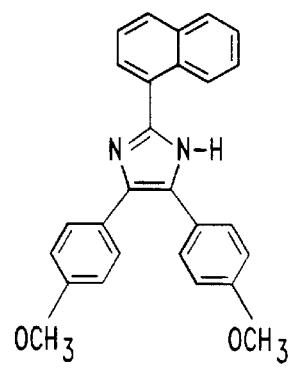
FIG. 7 is an illustration of the chemical compound 2-napthyl-4,5-(4-methoxyphenyl)imidazole.

To a 250 mL rb flask equipped as described in the previous example was added 4,4'-dimethoxybenzil (8.147 g; 30.14 mmol), 1-naphthaldehyde (5.65 g; 36.17 mmol), glacial acetic acid (90 mL), and ammonium acetate (43 g; 0.56 mol). The mixture was refluxed for 3 hours and then cooled to about 50° C. A precipitate resulted from the addition of water (1.2 L) over 30 minutes. The precipitate was filtered and dried, and an off-white product was obtained. Recrystallization from EtOH/DMAc (600 mL/90 mL) yielded yellow crystals. The product obtained was confirmed to be 2-napthyl-bis-4,5-(4-methoxyphenyl)imidazole. This compound is illustrated in FIG. 7.

EXAMPLE 6

Figure 8:
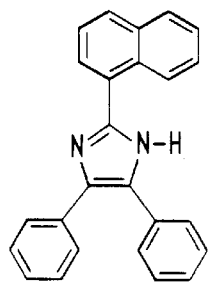
FIG. 8 is an illustration of the chemical compound 2-napthyl-4,5-(diphenyl)imidazole.

To a 250 mL rb flask equipped as described in the previous example was added benzil (8.147 g; 30.14 mmol), 1-naphthaldehyde (5.65 g; 36.17 mmol), glacial acetic acid (90 mL), and ammonium acetate (43 g; 0.56 mol). The mixture was refluxed for 3 hours and then cooled to about 50° C. A precipitate resulted from the addition of water (1.2 L) over 30 minutes. The precipitate was filtered and dried, and an off-white product was obtained. Recrystallization from EtOH/DMAc (600 mL/90 mL) yielded yellow crystals. The product obtained was confirmed to be 2-napthyl-4,5-(diphenyl)imidazole. This compound is illustrated in FIG. 8.

EXAMPLE 7

Figure 9:
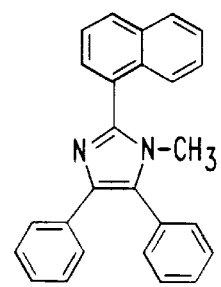
FIG. 9 is an illustration of the chemical compound 1-methyl-2-napthyl-4,5-(diphenyl)imidazole.

To a 100 mL rb flask equipped as described above was added the imidazole prepared in previous Example 6 (1 g; 2.89 mmol) and anhydrous THF (20 mL). The mixture was stirred at 25° C. for 2 minutes. Potassium tert-butoxide (0.356 g; 3.18 mmol) was added all at once, and a clear solution resulted. Iodomethane (0.5 g; 3.47 mmol) was added in portions over 1 minute, resulting in a yellow solution that became off-white after 20 minutes. The resulting solution was stirred at room temperature for another 60 minutes, and was then poured into water (200 mL). The THF was removed from the solution by suction at room temperature. The product was obtained by filtration and drying. The product was recrystallized from ethanol and was confirmed to be 1-methyl-2-napthyl-4,5-(diphenyl)imidazole. This product is illustrated in FIG. 9.

EXAMPLE 8

Figure 10:
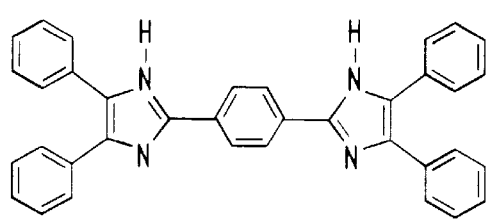
FIG. 10 is an illustration of the chemical compound 2,2'-(p-phenylene)-bis-(4,5-diphenylimidazole).

To a 500 mL rb flask equipped as described above was added terephthalaldehyde (5g; 37.28 mmol), benzil (15.57 g; 74.55 mmol), ammonium acetate (34.5 g; 447.36 mmol), and glacial acetic acid (100 mL). The mixture was refluxed for 2.5 hours. During this time an additional 150 mL of glacial acetic acid (in three 50 mL increments) was added to reduce the viscosity of the solution. The resulting mixture was poured into 500 mL of water. An off-white solid was obtained after the mixtue was filtered and dried. A yellow crystalline solid was obtained after recrystalization from DMAc. The resulting product was confirmed to be 2,2'-(p-phenylene)-bis-(4,5-diphenylimidazole). This product is illustrated in FIG. 10.

EXAMPLE 9

Figure 11:
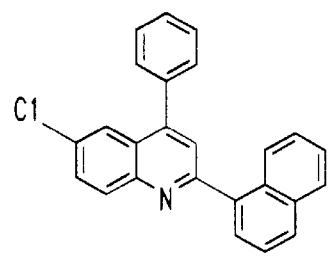
FIG. 11 is an illustration of the chemical compound 2-napthyl-4-phenyl-6-chloroquinoline.

To a 500 mL rb flask equipped as described above was added 2-amino-5-chlorobenzophenone (10 g; 43.16 mmol), acetophenone (7.35 g; 43.16 mmol), glacial acetic acid (60 mL) and sulfuric acid (2 mL). The mixture was heated to its reflux temperature and refluxed for three hours. The refluxed liquid was then poured into water (500 mL) and stirred rapidly. Sodium bicarbonate was added to the solution to adjust the pH thereof to about 5. An off-white compound was obtained by filtration and drying. Recrystallization from EtOH/DMAc yielded a product that was confirmed to be 2-napthyl-4-phenyl-6-chloroquinoline. This product is illustrated in FIG. 11.

EXAMPLE 10

Figure 12:
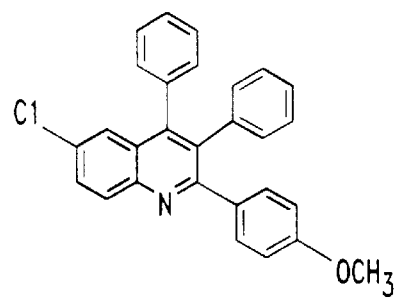
FIG. 12 is an illustration of the chemical compound 2-(p-methoxyphenyl)-3,4-diphenyl-6-chloroquinoline.

To a 500 mL rb flask equipped as described above was added 2-amino-5-chlorobenzophenone (10 g; 43.16 mmol), (4'-methoxy)-2-phenylacetophenone (7.35 g; 43.16 mmol), glacial acetic acid (60 mL) and sulfuric acid (2 mL). The mixture was heated to its reflux temperature and refluxed for three hours. The refluxed liquid was then poured into water (500 mL) and stirred rapidly. Sodium bicarbonate was added to the solution to adjust the pH thereof to about 5. An off-white compound was obtained by filtration and drying. Recrystallization from EtOH/DMAc yielded a product that was confirmed to be 2-(p-methoxyphenyl)-3,4-diphenyl-6-chloroquinoline. This product is illustrated in FIG. 12.

EXAMPLE 11

Figure 13:
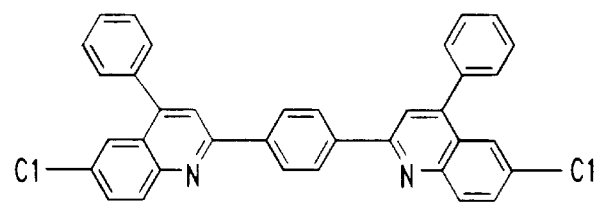
FIG. 13 is an illustration of the chemical compound 2,2'-(p-phenylene)-bis-(4-phenyl-6-chloroquinoline).

To a 500 mL rb flask equipped as described above was added 2-amino-5-chlorobenzophenone (11.43 g; 49.3 mmol), 1,4-diacetylbenzene (4 g; 24.7 mmol), glacial acetic acid (100 mL), and sulfuric acid (3–4 mL). The mixture was heated to reflux and refluxed overnight, after which the mixture was poured into water (500 mL). Sodium carbonate was added to the mixture to adjust its pH to about 5. The mixture was filtered and dried, and the resulting product was recrystallized from DMAc/DMF. The product was confirmed to be 2,2'-(p-phenylene)-bis-(4-phenyl-6-chloroquinoline), which is illustrated in FIG. 13.

EXAMPLE 12

Figure 14:
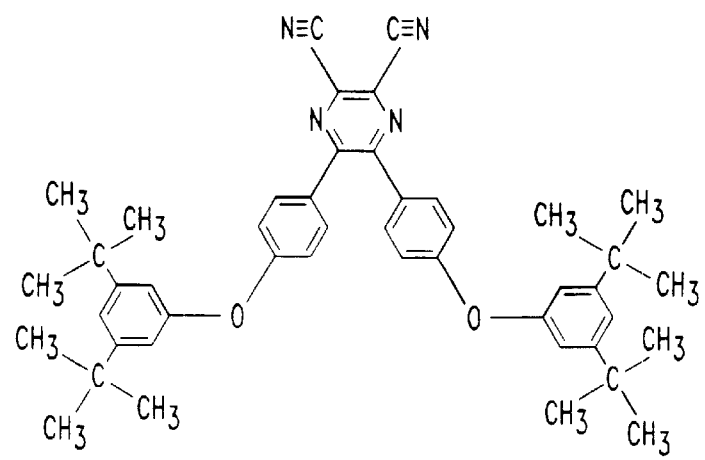
FIG. 14 is an illustration of the chemical compound 2,3-dicyano-5,6-(3",5"-ditert-butyl-4'-phenoxyphenyl)pyrazine.

To a 250 mL rb flask equipped as described above were added 4,4'-Bis[(3'',5''-di-tertbutyl)-4'-phenoxy]benzil, prepared as described in Strukelj, M., et al., "Solvent Effects on the Preparation of Novel Amorphous Poly(aryl ether benzil)s," *Macromolecules*, Vol. 27, p. 6277 (1994) (hereby incorporated by reference) (12.3 g; 19.9 mmol), diaminomaleonitrile (2.39 g; 22 mmol), glacial acetic acid (20 mL), and butylacetate (80 mL). The mixture was heated to its reflux temperature and refluxed for about 3.5 hours. The solution was then cooled to 23° C. and concentrated under reduced pressure. The resulting solid was recrystallized from EtOH/DMAc (10/1), and the product was determined to be 2,3-dicyano-5,6-(3'',5''-di-tert-butyl-4'-phenoxyphenyl)pyrazine, which is illustrated in FIG. 14.

EXAMPLE 13

The photoluminesence of the materials described in the previous examples was measured in both solution and thin film form. The photoluminesence of the solution was measured by exposing 0.1 g/l solutions of the materials to radiation from a tungsten lamp that emits light in the wavelength range of 300 nm to 800 nm. The exposing radiation was filtered using a monochromometer so that the wavelength of the exposing radiation was 365 nm. The resulting emission of the solution is described in Table 1 below. Thin films of the materials described in the previous examples were formed onto quartz discs (one inch in diameter and 1/16 inches thick; obtained from the General Electric Company) by measuring 80 mg of the material into a tungsten-molybdenum boat that was obtained from KurtLesker. The material was evaporated at a pressure of $10^{-6}$ Torr by applying about 10 Watts to the boat. An Infinicon quartz crystal thickness monitor was used to monitor the thickness of the films being formed on the quartz discs. The rate of evaporation was about 5 to 10 Å/sec. The films formed on the quartz discs had a thickness of about 800 Å. The photoluminesence of the resulting films was measured using a calibrated grating monochromater and photomultiplier tube system.

The photoluminesence (PL) and the film quality of the materials described in previous examples is reported in Table 1 below. In certain instances, two spectral peaks were detected, in which case two wavelengths are designated as peak wavelengths. In certain instances, the resulting films did not emit light. The films that did not emit are designated as "NE" (no emission) in Table 1 below. The film quality is designated as poor (P) if the film crystallized within 24 hours and is designated excellent (E) if it was clear and homogeneous and did not crystallize.

TABLE 1

| Example | Glass Transition $T_g$ (° C.) | Solution PL ($\lambda_{max}$) | Thin Film PL ($\lambda_{max}$) | Film Quality |
| --- | --- | --- | --- | --- |
| 1 | — | 440 | 426 | P |
| 2 | 27 | 415,445 | 445,515 | E |
| 3 | 25 | 419 | 424,429 | E |
| 4 | — | 405,427 | 447,495 | P |
| 5 | 89 | 430 | 445 | E |
| 6 | — | 420 | NE | E |
| 7 | 54 | 419 | NE | E |
| 8 | — | 405,423 | NE | E |
| 9 | 46 | 401,417 | NE | P |
| 10 | — | 403,419 | 395,417 | P |
| 11 | 232 | 395,418 | 427 | E |
| 12 | 84 | 457 | 480 | E |

The glass transition temperature ($T_g$) indicates the temperature at which the material undergoes a phase transition from a glass-like state to a rubber-like state. For some samples, a $T_g$ was not detectable (-). Although applicants do not wish to be held to a particular theory, applicants believe that carrier transport of the material is degraded above the $T_g$ of the material due to a phase transition from the amorphous (or microcystalline) to crystalline (crystal size in excess of 1000 Å). Therefore, materials with a higher glass transition temperature appear to be advantageous because they retain their carrier transport properties at higher temperature. However, the materials in examples 2, 3, 5, 7, and 12 are exceptions to this observation, because, although the $T_g$ of the materials is not high, the molecular structure of these materials hinders crystallization.

EXAMPLE 14

EL devices were made with films of some of the materials described in previous examples 1–12. Specifically, devices were made in which the blue emitter layers between the TAD and the ALQ layer were formed from the materials described in Examples 2 (FIG. 4), 3 (FIG. 5), 9 (FIG. 11), 10 (FIG. 12), 11 (FIG. 13), and 12 (FIG. 14). The material from Example 9 was selected to determine the performance of a device that contained a blue emitter layer formed from a material which did not provide detectable emission in film form in the previous example. These devices were formed by cleaning ITO-coated glass substrates (Low Ohmic ITO glass obtained from Balzer of Fremont Calif.) in an ultrasound bath with solvents in the following order: methanol, acetone, 1,1,1-trichloroethane, isopropanol, acetone, and methanol. The ITO coated glass substrates had a sheet resistance of 50 Ω/square. An about 600 Å-thick layer of TAD, which was commercially obtained from H.W. Sands Corp. of Jupiter, Fla., was formed on the glass substrate under a vacuum pressure of less than about $10^{-6}$ Torr. An about 150 Å-thick layer of the blue emitter material was then formed, under the vacuum conditions previously described, on the TAD layer. A film of the material from example 3 could not be formed on the substrate under these conditions because the material did not sublime. An about 600 Å-thick layer of ALQ was then formed on the emitter layer. An about 2000 Å-thick cathode layer was formed on the ALQ layer. The cathode was a layer of aluminum which was formed using conventional techniques.

The resulting LEDs were 1 square mm in area. These LEDs were driven with direct currents up to 5 A/cm² with a bias in the range of about 10 V to about 40 V. The current-voltage characteristics of the devices were measured using two coaxial probes (Model No. Pr-240 obtained from Wentworth Labs of Brookfield, Conn.) and a Model 4155 A or 4145 B Semiconductor Parameter Analyzer obtained from Hewlett Packard. The external quantum efficiencies of the device were determined using a calibrated silicon photodiode in conjunction with a Hewlett-Packard 4145 B semiconductor parameter analyzer. The external quantum efficiency ($\eta_{ext}$ in units of photons/electrons) was calculated from the measured photocurrent ($I_{PC}$) and the injection current ($I_{INJ}$) using the following equation:

$$\eta_{ext} = I_{PC}/(I_{INJ} \times \eta_{PD})$$

where $\eta_{PD}$ is the efficiency of the photodiode which was about 0.7. The electroluminesence spectra of the multilayer LEDs were measured using a 0.5 meter spectrometer and a CCD array detector. The results of these measurements are reported in TABLE 2 below.

TABLE 2

| Emitter Material | Emission Range (nm) | Peak Emission (nm) | External Quantum Efficiency (%) |
|---|---|---|---|
| 2 | 400–700 | 450–575 | 0.3–0.7 |
| 9 | 450–700 | 500–600 | 0.06 |
| 10 | 380–700 | 450–525 | 0.02 |
| 11 | 500–700 | 500–600 | 0.002 |
| 12 | 425–700 | 550–650 | 0.012 |

Many devices were made with a layer of material 2 as the blue-emitting layer which explains the range of quantum efficiencies reported for that device. As seen by Table 2, the material of example 2, 2-napthyl-4,5-(4-methoxyphenyl) oxazole, provided a device with a broad emission range and a broad peak emission range which extended to wavelengths well below 500 nm. Such a device emits white light. Furthermore, the device exhibited a highly efficient emission (i.e., about 0.5 lumens/Watt; which is about 0.7% quantum efficiency), which makes it particularly attractive. By contrast, devices with the blue-emitter materials from Examples 9–12 did not perform as well. The poorer performance of devices with blue-emitter materials from examples 9 and 10 might be explained by the fact that the films formed from these materials were of poor quality (see Table 1). It is believed that these poor quality films did not improve the emission range or the efficiency of the ALQ in the devices containing these films. Devices with blue-emitter material from examples 11 and 12 also did not perform as well as the device formed with the example 2 blue-emitter material. Applicants believe that these materials did not perform as well as the example 2 blue-emitter material because they were not sufficiently purified.

The invention claimed is:

1. An EL device comprising:

a glass substrate;

an anode formed over the glass substrate;

a layer of a hole transporter material formed over the anode;

a layer of a blue emitting material formed over the hole transporter material, wherein the blue-emitting material has a non-polymerizable molecular structure that comprises a five or six-membered heterocyclic moiety wherein the structure is selected from the group consisting of oxazole, imidazole, quinoline and pyrazine with at least three substituents pendant thereto, at least two of which are organic and wherein the oxazole structure is:

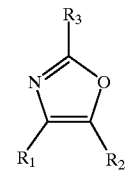

wherein $R_1$ and $R_2$ are the same and are selected from the group consisting of phenyl and methoxyphenyl and $R_3$ is different from $R_1$ and $R_2$ and is selected from the group consisting of phenyl and naphthyl or

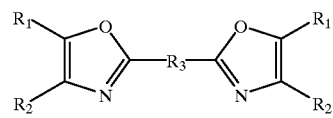

wherein $R_1$ and $R_2$ are the same and are selected from the group consisting of phenyl and methoxyphenyl and $R_3$ is selected from the group consisting of phenylene and naphthylene, the imidazole structure is:

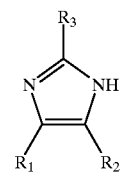

wherein $R_1$ and $R_2$ are the same and are selected from the group consisting of phenyl and methoxyphenyl and $R_3$ is different from $R_1$ and $R_2$ and is selected from the group consisting of phenyl and naphthyl, or

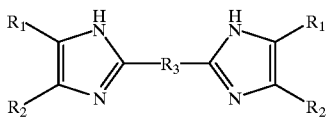

wherein $R_1$ and $R_2$ are the same and are selected from the group consisting of phenyl and methoxyphenyl and $R_3$ is selected from the group consisting of phenylene and naphthylene, the quinoline structure is:

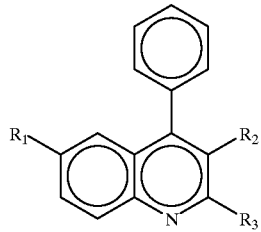

wherein $R_1$ is a halogen moiety selected from the group consisting of fluorine, chlorine, and bromine, $R_2$ is selected from the group consisting of hydrogen, phenyl, methoxyphenyl, and naphthyl, and $R_3$ is selected from the group consisting of phenyl, methoxyphenyl, and naphthyl, or

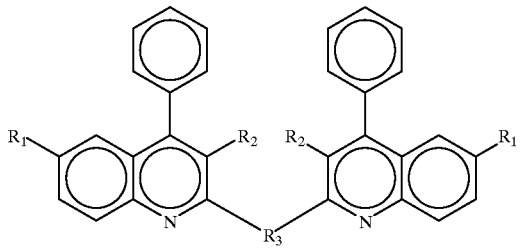

wherein $R_1$ is a halogen moiety selected from the group consisting of fluorine, chlorine, and bromine, $R_2$ is selected from the group consisting of hydrogen, phenyl, methoxyphenyl, and naphthyl, and $R_3$ is selected from the group consisting of phenylene, methoxyphenylene, and naphthylene, and the pyrazine structure is:

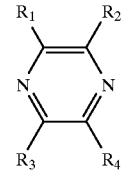

wherein $R_1$ and $R_2$ are cyano and $R_3$ and $R_4$ are selected from the group consisting of tert-butyl phenoxyphenyl and methoxy phenyl, and wherein the layer of blue-emitting material has a crystal size of less than about 1000 Å;

a layer of an electron transporter material formed over the blue emitting material; and a cathode formed over the layer of electron transporter material;

wherein the device emits white light in the wavelength range of about 400 nm to about 650 nm.

2. The EL device of claim 1 wherein the blue-emitting layer has a thickness that is less than about 600 Å.

3. The EL device of claim 2 wherein the thickness of the blue-emitting layer is about 100 Å to about 300 Å.

4. The EL device of claim 2 wherein the hole transporter is a diamine layer.

5. The EL device of claim 4 wherein the diamine is bis(triphenyl)diamine.

6. The EL device of claim 5 wherein the electron transporter layer is ALQ.

7. The EL device of claim 6 wherein the anode is a layer of indium tin oxide and the cathode is an aluminum-containing layer.

8. The EL device of claim 7 wherein the cathode is a dual layer of lithium and aluminum.

9. The EL device of claim 7 further comprising two additional layers of ALQ one of which is doped with a red-emitting dye, wherein the doped ALQ layer is sandwiched between two other ALQ layers.

10. The EL device of claim 1 wherein the blue-emitting material is 2-napthyl-4,5-(4-methoxyphenyl)oxazole.

* * * * *